United States Patent [19]

Sano

[11] Patent Number: 5,248,621
[45] Date of Patent: Sep. 28, 1993

[54] METHOD FOR PRODUCING SOLAR CELL DEVICES OF CRYSTALLINE MATERIAL

[75] Inventor: Masafumi Sano, Nagahama, Japan

[73] Assignee: Canon Kabushiki Kaisha, Tokyo, Japan

[21] Appl. No.: 778,669

[22] Filed: Oct. 18, 1991

[30] Foreign Application Priority Data

Oct. 23, 1990 [JP] Japan ................................ 2-283470

[51] Int. Cl.⁵ ............................................. H01L 31/042
[52] U.S. Cl. ............................................... 437/3; 437/83; 437/86; 437/974; 437/977; 148/DIG. 12; 136/256
[58] Field of Search ............ 148/DIG. 12, DIG. 135, 148/DIG. 138; 136/256, 258, 260-264; 437/3, 83, 86, 101, 974, 977

[56] References Cited

U.S. PATENT DOCUMENTS

| | | | |
|---|---|---|---|
| 4,514,582 | 4/1985 | Tiedje et al. | 437/977 |
| 4,554,727 | 11/1985 | Deckman et al. | 437/977 |
| 4,771,016 | 9/1988 | Bajor et al. | 148/DIG. 12 |
| 4,816,420 | 3/1989 | Bozler et al. | |
| 4,835,005 | 5/1989 | Hirooka et al. | |
| 4,916,510 | 4/1990 | Sano et al. | |
| 5,013,681 | 5/1991 | Godbey et al. | 437/86 |

FOREIGN PATENT DOCUMENTS

| | | | |
|---|---|---|---|
| 59-123279 | 7/1984 | Japan | 437/977 |
| 59-127891 | 7/1984 | Japan | 437/977 |

OTHER PUBLICATIONS

"Point-Contact Silicon Solar Cells", R. Swanson et al. Electron Devices, vol. ED-31, No. 5 May 1984, pp. 661-664.

Primary Examiner—George Fourson
Attorney, Agent, or Firm—Fitzpatrick, Cella, Harper & Scinto

[57] ABSTRACT

A solar cell device is produced by forming at least one semiconductor layer of single crystalline material having an uneven surface on a substrate. A photovoltaic element utilizing the semiconductor layer is formed and bonded to another substrate. The produced solar cell device has a large area, high conversion efficiency and may be mass produced at low cost.

16 Claims, 6 Drawing Sheets

METHOD FOR PRODUCING SOLAR CELL DEVICES OF CRYSTALLINE MATERIAL

BACKGROUND OF THE INVENTION

1. Field of the Invention

The present invention relates to solar cell devices, more particularly, to a method for producing solar cell devices that scatter incident light and effectively utilize light absorbed by active layers thereof, whereby the power outputting property of the solar cell device is stably improved.

2. Related Background Art

Solar cell devices are used as energy sources in various equipments at the present time.

In solar cell devices, PN junctions or PIN junctions are used in functional portions, and silicon is generally the semiconductor which forms the PN junction. It is preferable from the viewpoint of efficiency of conversion of optical energy into electromotive force to use single crystal silicon as a semiconductor material. However, the use of amorphous silicon may be preferred for increasing the area and decreasing the cost. On the other hand, the use of polycrystalline silicon has recently been investigated to obtain solar cell devices at the low cost of amorphous silicon and the high conversion efficiency of single crystal silicon. A high efficiency of energy conversion equivalent to that of a solar cell device made of single crystal silicon has yet to be obtained.

With respect to single crystal silicon, various techniques of increasing efficiency, for example, the point-contact method (Richard M. Swanson et al., IEEE, Vol. ED-31, No. 5, MAY (1984) P661), the surface passivation technique and the technique of decreasing the electrode area (T. Nammori, Research Forum of Crystalline Solar cell devices, (1989) p77, Tokyo), the light-trapping technique (T. Uematsu et al., Conf. Record of the 20th IEEEPVSC (1988) p792) and so on, have been investigated. However, at present, all these techniques are unsatisfactory from the viewpoint of decrease in the cost since it is necessary for decreasing cost to sufficiently decrease the thickness of silicon.

In addition, conventional methods of decreasing the thickness of a single crystal silicon solar cell device can use only a plate-like substrate on which a single crystal silicon thin layer is formed by etching. The conventional methods thus have the problem that the substrate is distorted by a heat treatment process such as thermal diffusion, oxidation or the like or curved by formation of electrodes thereon. The methods also cause many difficulties in forming a microstructure, stabilizing the formation process, increasing the area and the like.

U.S. Pat. No. 4,816,420 discloses a method for producing a tandem solar cell which comprises; forming a mask layer on a crystal substrate, depositing crystalline material at exposed areas of the substrate under conditions that provide lateral growth crystalline material over the mask layer, continuing lateral overgrowth until a sheet of single crystal material is formed, separating the sheet from the substrate, forming a thin-film solar cell from the separated sheet, and bonding the solar cell to another solar cell to form a tandem solar cell.

However, it cannot be said that this method is satisfactory for providing a solar cell device comprising a relatively thin semiconductor layer having a high conversion efficiency, and there is still room for improvement. Similarly, the yield of the method also has room for improvement.

SUMMARY OF THE INVENTION

It is an object of the present invention to produce a solar cell device with high yield having a photoelectric conversion efficiency higher than that of a conventional solar cell device having a layer formed by using the same material with the same thickness.

It is another object of the present invention to provide a solar cell device producing method which is suitable for forming a solar cell panel having a large area at low cost.

In order to achieve the objects of the invention, the method for producing a solar cell device comprises forming a single crystal layer having at least one uneven portion on a substrate, forming a photovoltaic element by utilizing the layer and then bonding the photovoltaic element to another substrate.

BRIEF DESCRIPTION OF THE DRAWINGS

FIGS. 1($a$)–1($c$), 2($a$)–2($b$) and 3($a$)–3($c$) are schematic sectional views showing the steps in a method of producing solar cell devices of the present invention;

DETAILED DESCRIPTION OF THE PREFERRED EMBODIMENTS

In the present invention, a single crystal substrate made of Si, Ge, C, SiC or SiGe or a substrate made of GaAs, InP, CdTe or the like is used. A substrate made of a non-single crystal material such as silicon oxide, silicon nitride or the like may be used. A substrate made of single crystal Si on which $SiO_2$ is formed, a substrate made of a resin or the like on which any one of the above materials is coated may be, of course, used.

When a semiconductor layer having a plurality of single crystal regions and an uneven surface with a plurality of crystal surfaces is formed by using a substrate made of a non-single crystal material and having a substantially flat surface, the process of forming single crystal semiconductor layers disclosed in U.S. patent Ser. No. 538,007, "Photovoltaic Device and Method for Producing the Same", by the assignee of the present invention (filed on Jun. 14, 1990) may be employed.

On the other hand, when a semiconductor layer having an uneven surface is formed by using a single crystal substrate, the single crystal substrate preferably has the unevenness formed thereon.

Examples of deposited film-forming methods for forming semiconductor layers each having an uneven surface on the above various substrates include the physical vapor phase deposition process (PVD) and the chemical vapor phase deposition process (CVD). Particularly, an epitaxial growth method comprising a bias sputtering process or CVD process is preferable for forming a deposited film having single crystal regions. The CVD process described in detail below is particularly preferable for increasing the deposition rate and forming a single crystal semiconductor layer having an uneven surface of high quality. The CVD process is disclosed in detail in the specification of U.S. Pat. No. 4,835,005.

A preferred process used in the present invention include forming V-shaped grooves as uneven portions on a single crystal silicon wafer so as to confine incident light in a semiconductor layer, as shown in FIG. 1, and forming an insulating layer comprising a very thin film on the V-shaped grooves.

The formation of the V-shaped grooves preferable for displaying the light-trapping effect is briefly described below.

Figure 1A:
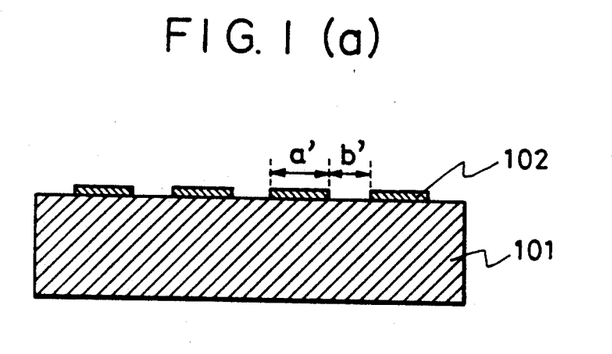

The method of forming the V-shaped grooves having the light-trapping effect comprises forming an etching mask comprising a silicon oxide film, silicon nitride film 101 or the like on a silicon wafer 102 having the (100) planes, as shown in FIG. 1(a), and then etching the silicon wafer by using a solution such as a potassium hydroxide solution, hydrazine solution or the like, which causes anisotropic etching to take place. The etching inwardly proceeds in the (100) planes of the wafer with the passage of time to finally form the V-shaped grooves surrounded by the (111) planes. The inclination of each of the V-shaped grooves is determined by the crystal plane azimuth, and the open angle thereof is about 70.5°.

The depth of each of the V-shaped grooves (etching depth) can be controlled at will by adjusting the thickness of the silicon wafer having the (100) planes and the distance between the etching masks.

Figure 1B:
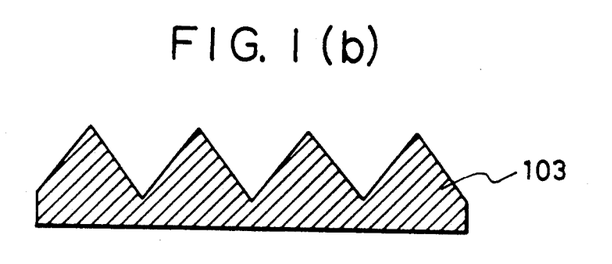

The etching masks are then removed by a solution such as an aqueous hydrogen fluoride solution which can dissolve the etching masks to form V-shaped grooves 103 having a structure which exhibits the light-trapping effect, as shown in FIG. 1(b).

Figure 1C:
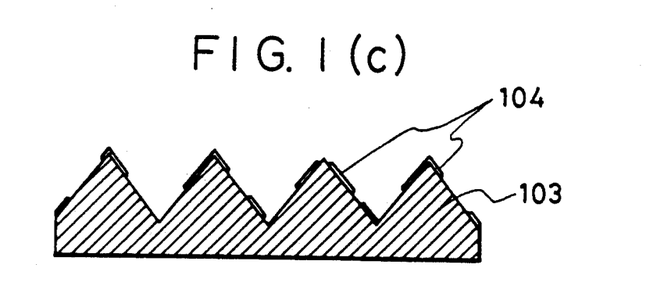

A silicon oxide thin film 104 is then non-uniformly deposited, by the PVD process, CVD process, thermal oxidation process or the like, to form an insulating layer on the surfaces of the V-shaped grooves 103 formed into a structure having the light-trapping effect, as shown in FIG. 1(c). This causes the single crystal Si ground surface to be exposed from a plurality of portions and thus produces differences in surface energy. In addition, the occurrence of edge energy facilitates crystal growth and the separation of the grown crystal layer from the V-shaped grooves formed into a structure having the light-trapping effect. Although the thickness of the silicon oxide film 104 can be appropriately determined to a desired value, the thickness is preferably 2Å to 100Å, more preferably 3Å to 50Å and most preferably 4Å to 10Å. Such a thin film can be easily formed as a discontinuous film by a conventional film-forming method.

Figure 2A:
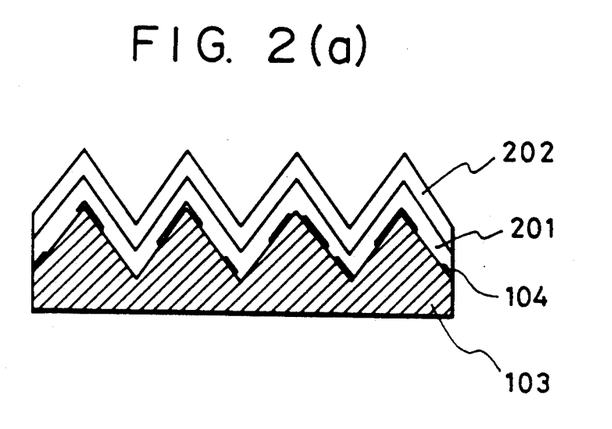

Another preferred process used in the present invention illustrated in FIG. 2 is to form a first conductive layer 201 substantially made of a single crystal on the substrate, which is formed into a structure having the light-trapping effect shown in FIG. 1(c) and which is disposed in a film-forming space for forming a deposited film, by employing the chemical function of the active species (A) produced by decomposing a compound containing silicon and halogen and the active species (B) produced by a chemical substance having a chemical interaction with the active species (A) and used for forming a film, the active species (A) and (B) being simultaneously or separately introduced in the space, and to form a second conductive layer 202 substantially made of a single crystal on the first single crystal layer 201, as shown in FIG. 2(a). Although the thickness of each of the single crystal layers 201 and 202 is appropriately determined according to a desired value, the thickness of the layer 202 is preferably 3 $\mu$m to 50 $\mu$m, more preferably 4 $\mu$m to 30 $\mu$m and most preferably 5 $\mu$m to 20 $\mu$m.

In this method, chemical interaction results from the coexistence of the active species (A) produced by decomposing a compound containing silicon and halogen by the activation energy applied thereto in an active space (A) different from the film-forming space and the active species (B) produced by a chemical substance for forming a film, in place of the production of plasma in the film-forming space for forming a deposited film. Thus the deposited film is not adversely affected by plasma, sputtering by the ions produced, electrons and the like. The present invention can also stabilize the CVD process by controlling at will the atmospheric temperature of the film-forming space, and the substrate temperature according to desired values.

This method is different from the usual CVD process in that active species previously activated in the space (referred to as "activation space" hereinafter) different from the film-forming space are used. This enables attempts to be made to rapidly increase the film-forming speed of the conventional CVD process and to further decrease the temperature of the substrate during the formation of the deposit film. This method is also a method for easily forming a single crystal layer.

In the present invention, an active species having a life of 0.1 second or more, more preferably 1 second or more and most preferably at least 10 seconds, is selected and used as the active species (A) introduced into the film-forming space and obtained from the activation space (A) according to the considerations of productivity and ease of handling. The components of the active species (A) are components of the deposited film formed in the film-forming space. The chemical substance for forming a film is activated by the activation energy in the activation space (B) to produce the active species (B). The active species (B) is introduced into the film-forming space and chemically interact with the active species (A) which is simultaneously introduced into the activation space (A) and which contains the components forming the deposited film during the formation of the deposited film. For example, a compound in which the hydrogen atoms of a chain or cyclic silane compound are partially or wholly substituted by halogen atoms is used as the compound which is introduced into the activation space (A) and which contains silicon and halogen. Examples of such compounds include cyclic silicon halides expressed by the formula, Si$_u$Y$_{2u+2}$ (wherein u denotes a positive number, and Y denotes at least one element selected from F, Cl, Br and I), cyclic silicon halides expressed by the formula, Si$_v$Y$_{2v}$ (wherein v denotes a positive number of 3 or more, and Y denotes the same as that described above), and chain or cyclic compounds expressed by the formula, Si$_u$H$_x$Y$_y$ (wherein u and y denote the same as those described above, and x+y=2u or 2u+2) and the like.

Examples of such compounds include SiF$_4$, (SiF$_2$)$_5$, (SiF$_2$)$_6$, Si$_2$F$_6$, Si$_3$F$_8$, SiHF$_3$, SiH$_2$F$_2$, SiCl$_4$, (SiCl$_2$)$_5$, SiBr$_4$, (SiBr$_2$)$_5$, Si$_2$Cl$_6$, Si$_2$Br$_6$, SiHCl$_3$, SiH$_3$Cl, SiH$_2$Cl$_2$, SiHBr$_3$, SiHI$_3$, Si$_2$Cl$_3$F$_3$ and the like, all of which are gaseous or can easily be gasified.

The above compounds containing silicon and halogen can be combined with silicon, other silicon compounds, hydrogen or halogen compounds (for example, F$_2$ gas, Cl$_2$ gas, gasified Br$_2$, I$_2$ and the like) for the purpose of producing the active species (A), as the occasion demands.

The method of producing the active species (A) in the activation space (A) can employ activation energy such as electrical energy such as microwaves, RF, low-frequency, DC or the like, thermal energy produced by a heater or an infrared ray, or optical energy in consideration of various conditions and the apparatus used.

Hydrogen gas and/or halogen gas (for example, $F_2$ gas, $Cl_2$ gas, gasified $Br_2$, $I_2$ and the like) can be effectively used as the film-forming chemical substance for producing the active species (B) in the activation space (B). Inert gas such as helium, argon, neon gas or the like can be used together with the film-forming chemical substance. When a plurality of film-forming chemical substances are used, the chemical substances may be previously mixed and then introduced in a gaseous state into the activation space (B) or separately introduced in a gaseous state into the activation space (B) from independent supply sources. Alternatively, the chemical substances may be separately introduced into activation spaces so as to be separately activated therein.

In the present invention, although the ratio between the amounts of the active species (A) and (B) introduced into the film-forming space is appropriately determined depending upon the conditions for forming a film, the types of the active species used and the like according to desired values, the ratio is preferably 10:1 to 1:10 (ratio of introduction flow rate), more preferably 8:2 to 4:6.

The deposited film formed by the method of the invention can be doped with impurity elements used in the field of semiconductor during film formation or after the film formation. Preferable examples of p-type elements used as impurity elements include the elements in the Group IIIA in the Periodic Table, such as B, Al, Ga, In, Tl and the like, and preferable examples of n-type elements include the Group VA in the Periodic Table, such as P, As, Sb, Bi and the like. Particularly, elements B, Ga, P, Sb and the like are preferred. The amount of the doping impurities is appropriately determined according to desired electrical and optical characteristics.

It is preferable to select as the substance (substance for introducing impurities) containing impurity elements a compound which is gaseous at room temperature and atmospheric pressure or which is gaseous at least under activation conditions and can be easily gasified by an appropriate vaporizer. Examples of such compounds include $PH_3$, $P_2H_4$, $PF_3$, $PF_5$, $AsH_3$, $AsF_3$, $AsF_5$, $AsCl_3$, $SbH_3$, $SbF_5$, $BH_3$, $BF_3$, $BCl_3$, $BB_{r3}$, $B_2H_6$, $B_4H_{10}$, $B_5H_9$, $B_5H_{11}$, $B_6H_{10}$, $B_6H_{12}$ $AlC_{13}$ and the like. The compounds containing impurity elements may be used singly or in combinations of two or more compounds.

A compound containing impurity elements may be introduced in a gaseous state directly into the film-forming space or activated in the activation space (A) or (B) or a third activation space (C) and then introduced into the film-forming space.

In the CVD process, the active species chemically interacts with a precursor which can be used as a raw material for the deposited film formed and which has no or substantially no ability to form the deposited film in its energy state. For example, they provide the precursor with energy or chemically react with the precursor to bring the precursor into a state which allows the precursor to form the deposited film. Thus the active species may either contain components which form the deposited film or none of the components.

Figure 2B:
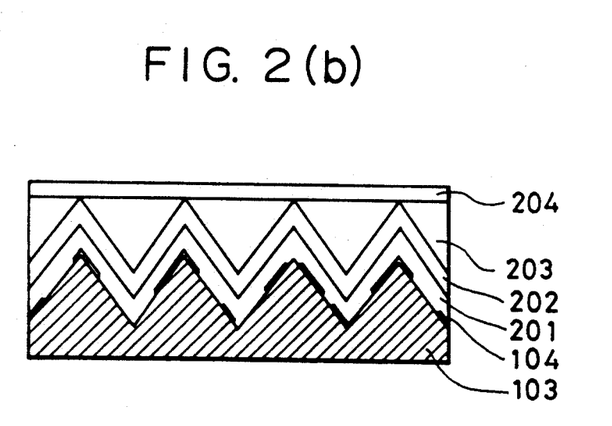

As shown in FIG. 2(b), the second conductive layer substantially made of a single crystal is fixed to a support 204 by bonding it by a conductive adhesive 203. Examples of adhesives used as the conductive adhesive 203 include Ag paste, Ag-Cu paste, Ni paste and the like. Examples of materials used as the support 204 for fixing the single crystal layer include conductive supports such as a stainless plate, an aluminum plate, an iron plate and the like.

Figure 3A:
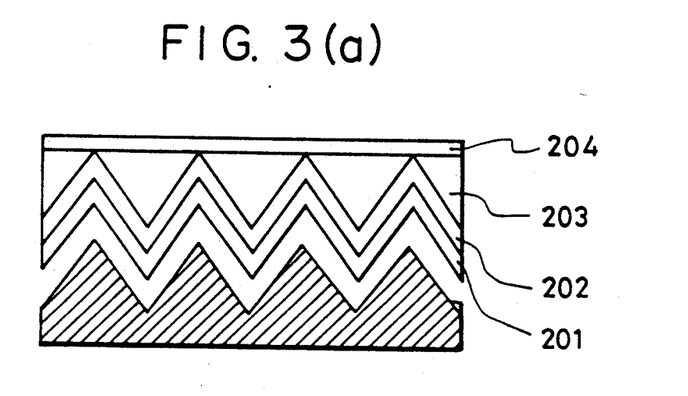
Figure 3B:
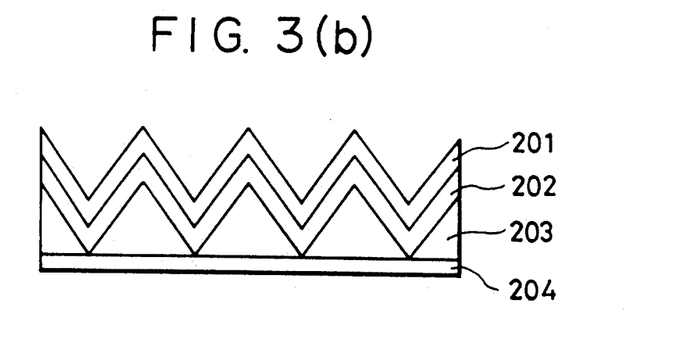

A further preferred technique used in the present invention is separation of the substrate 103 having the V-shaped grooves formed into a structure having the light-trapping effect shown in FIG. 2(b) from the first conductive layer 201 substantially made of a single crystal, as shown in FIGS. 3(a) and 3(b).

A brief description is made of a method of separating the substrate 103 having the V-shaped grooves formed into a structure having the light-trapping effect from the first conductive layer 201 substantially made of a single crystal.

The thin silicon oxide film 104 nonuniformly deposited, by the chemical vapor deposition (CVD) process or the like, on the surfaces of the V-shaped grooves 103 formed into a structure having the light-trapping effect, as shown in FIG. 2(b) is dissolved in a solution such as an aqueous hydrogen fluoride solution or the like, which can dissolve the silicon oxide film, while applying ultrasonic waves thereto to separate the first conductive layer 201 substantially made of a single crystal from the surfaces of the V-shaped grooves formed into a structure having the light-trapping effect.

Figure 3C:
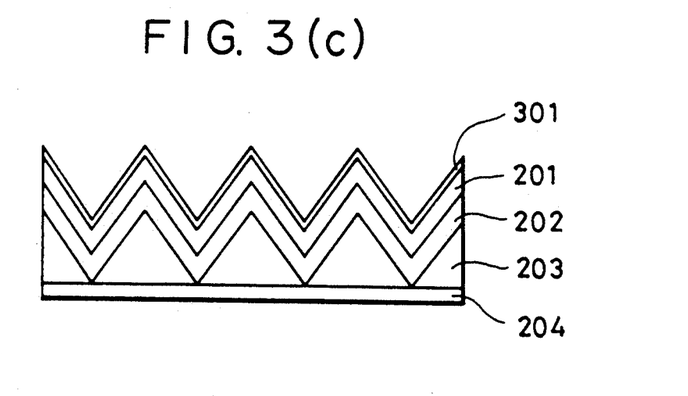
Figure 4:
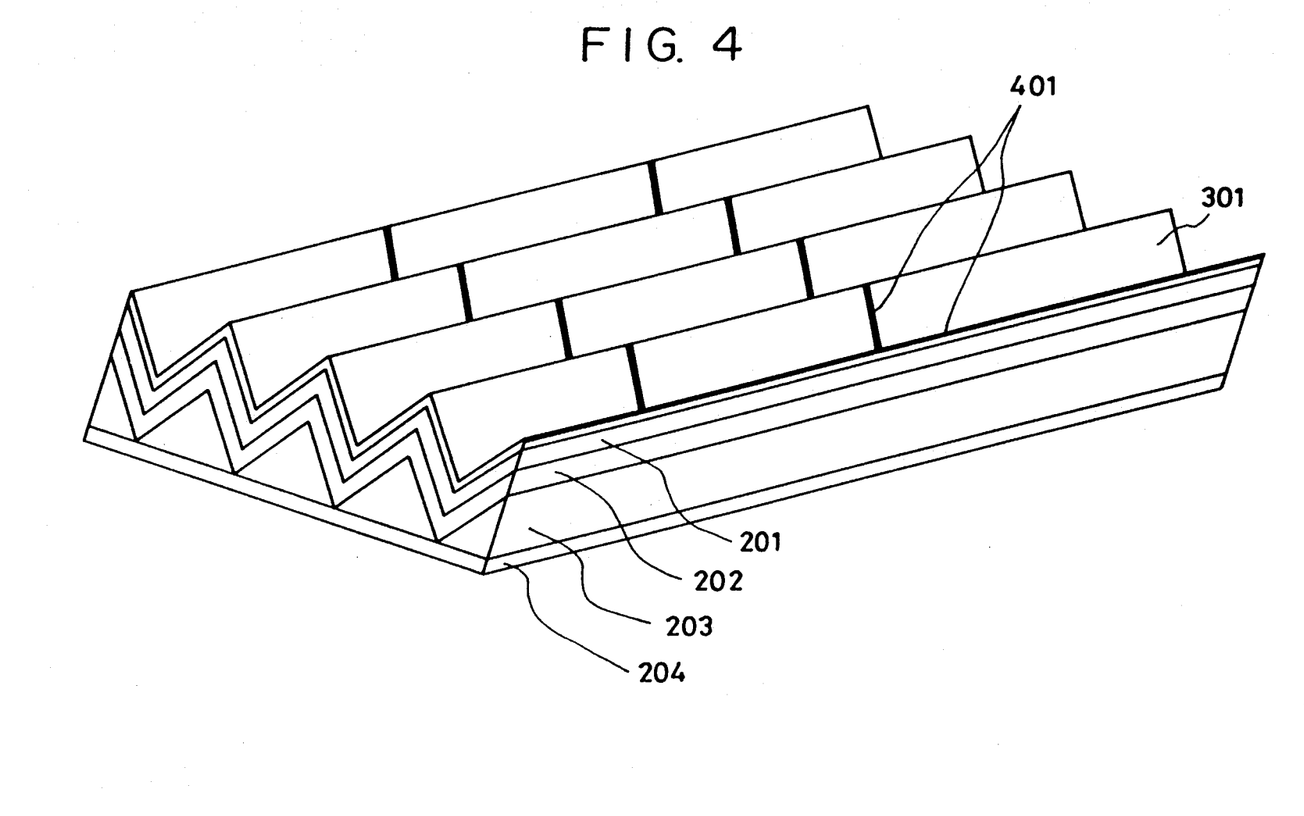
FIG. 4 is a schematic perspective view of the solar cell device produced by the method of the present invention.

A transparent electrode 301 is then formed on the separated first conductive layer 201 substantially made of a single crystal by evaporating $SnO_2$, $In_2O_3$, ITO (Indium-Tin Oxide) or the like, as shown in FIG. 3(c). As shown in FIG. 4, current collecting electrodes 401 are then formed on the transparent electrode, for example, by vacuum evaporation of Ag, Ni, Au, Ti, Pd, Al or the like or a printing method comprising printing conductive paste containing powder of Ag, Al, Cu, Ni or the like and then burning it to produce a solar cell device. The separated substrate having the V-shaped grooves 103 formed into a structure having the light-trapping effect is returned to the process of nonuniformly depositing the silicon oxide film 104 and used as a substrate over again.

An embodiment of the present invention relates to a method for producing a solar cell device comprising the steps of forming a thin insulating layer on the surface of a substrate formed into a structure having the light-trapping effect; forming a first conductive layer substantially made of a single crystal on the substrate which is disposed in a film-forming space for forming a deposited film, by employing the chemical reaction between the active species (A) produced by decomposing a compound containing silicon and halogen and the active species (B) which chemically interacts with the active species (A) and which is produced by a chemical substance used for forming a film, the active species (A) and (B) being simultaneously or separately introduced; forming a second conductive layer substantially made of a single crystal on the first conductive layer substantially made of a single crystal by the same method as that employed for the first layer; and separating the first and second layers each substantially made of a single crystal from the surface of the substrate formed into a structure having the light-trapping effect.

Although the present invention is described in detail below with reference to examples, the present invention is not limited to these examples.

EXAMPLE 1

(Step of forming V-shaped grooves having the light-trapping effect and being easily separated)

As shown in FIG. 1(a), a thermal oxide film was formed to a thickness of 2000Å as an insulating layer 102 on the surface of a (100) silicon wafer 101 having a thickness of 250 μm. Etching was then performed by using photolithography to form a substrate having insulating layers 102 having a width (a') of 1 μm and distances (b') of 200 μm. Crystal surface selective etching was then performed in an aqueous KOH solution or hydrazine solution at about 70° C. for about 24 hours, followed by flowing-water washing. The insulating layers 102 serving as etching masks were then removed by immersion in a 5% aqueous hydrogen fluoride solution for 1 hour, followed by flowing-water washing and drying to form the V-shaped grooves 103 formed into a structure having the light-trapping effect, as shown in FIG. 1(b).

The substrate having the V-shaped grooves 103 was then placed in a reaction chamber in a conventional RF plasma CVD apparatus having a capacity coupled electrode. Discharge was induced in the reaction chamber for several minutes at a substrate temperature of 270° C., a high frequency power of 50 W, a high frequency of 13.56 Hz and a pressure of 0.8 Torr, while introducing $SiH_4$ gas and $O_2$ gas at 20 sccm and 40 sccm, respectively, from separate systems. As a result, a nonuniform silicon oxide thin film 104 having a thickness of 8Å was formed so that the single crystal was partially exposed therefrom, as shown in FIG. 1(c).

(Formation of Crystal Layer)

Figure 5:
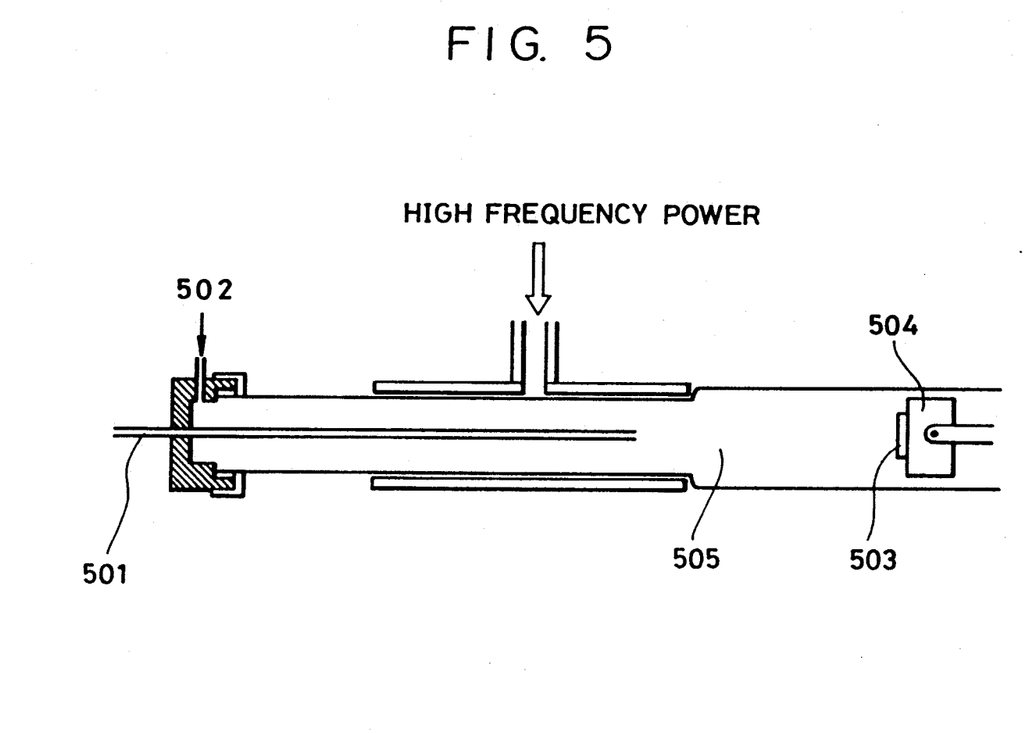
FIGS. 5 and 6 are schematic drawings of the film-forming apparatuses used in Embodiments 1 and 2, respectively.

A crystal layer was formed on the surface of the substrate having the V-shaped grooves 103 formed into a structure having the light-trapping effect by using the apparatus shown in FIG. 5. In FIG. 5, reference numeral 501 denotes a gas inlet tube for introducing a compound containing silicon and halogen; reference numeral 502, a gas inlet tube for introducing a film-forming chemical substance which chemically reacts with the active species (A) produced by decomposing the compound containing silicon and halogen; reference numeral 503, a substrate; and reference numeral 504, a holder for holding the substrate 503, which holder contains a heater so that the substrate temperature can be appropriately set. Each of the gases introduced through the gas inlet tubes 501 and 502 includes unreacted substances and reaction products and is exhausted by a vacuum pump (not shown).

The compound containing silicon and halogen and introduced through the gas inlet tube 501 is partially or wholly decomposed by control of a high frequency power generator and introduced into an association space 505. On the other hand, the gas which produces the active species (B) and which is introduced through the gas inlet tube 502 is introduced and decomposed into plasma to produce large amounts of active species (B) which is introduced into the association space 505. The active species (A) which are products of decomposition of the compound containing silicon and halogen and the active species (B) which chemically reacts with the active species (A) chemically react in the association space 505 and are transported to the substrate 503. A deposited film is formed by reaction on the substrate surface.

$SiF_4$ gas at 75 sccm and $H_2$ and Ar gases each at 9.75 sccm were introduced through the gas inlet tubes 501 and 502, respectively, according to the conditions for producing crystalline silicon shown in Table 1. The pressure in the film-forming space was adjusted to 380 Torr by using an exhaust valve (not shown). A high-frequency power of 2.45 Hz was adjusted to 400 W, and deposition was then started. A Si (100) wafer (resistivity of about 1 kΩcm) was used as the substrate 503. This substrate was first washed with an organic solvent and then by a washing method generally known as RCA washing (boiling for 10 minutes in a solution of $NH_3$, $H_2O_2$ and $H_2O$ at a molar ratio of 1:1:4 and then boiling for 10 minutes in a solution of HCl, $H_2O_2$ and $H_2O$ at a molar ratio of 1:1:4). The substrate was then dipped in an etching solution (molar ratio $HF:H_2O=1:9$) for 30 seconds.

TABLE 1

| | |
|---|---|
| Flow rate ($SiF_4$) | 75 sccm |
| Flow rate ($H_2$) | 9 sccm |
| Flow rate (Ar) | 75 sccm |
| High frequency power | 400 W |
| Substrate temperature | 410° C. |
| Pressure | 380 mTorr |

Crystal silicon was deposited at a high deposition rate of 18 Å/s under the above production conditions, and the Kikuchi band was observed in the reflection type fast electron beam diffraction figure. It was thus found that the crystal silicon film formed was an excellent single crystal thin film.

A substrate having the V-shaped grooves formed into a structure having the light-trapping effect, as shown in FIG. 1(c), was used as the substrate 503, and crystalline silicon was deposited on the substrate by using the apparatus shown in FIG. 5 under the conditions for producing crystalline silicon shown in Table 1 (FIG. 2(a)). However, the substrate 503 was not subjected to organic washing and RCA washing and then HF dipping. The first conductive layer 201 substantially made of a single crystal was deposited on the surfaces of the V-shaped grooves formed into a structure having the light-trapping effect by introducing, through the gas inlet tube 502, as a substance for doping impurities $B_2H_6$/Ar gas at 1 ppm relative to $SiF_4$ gas together with $H_2$ and Ar gas. The second conductive layer 202 substantially made of a single crystal was deposited as a silicon crystal layer by introducing through the gas inlet tube 502 as a substance for doping impurities $PH_3$/Ar gas at 1 ppm relative to $SiF_4$ gas together with $H_2$ and Ar gas.

After the substrate 503 on which the silicon crystal layers were deposited had been spontaneously cooled from the substrate temperature 410° C., the substrate 503 was removed from the deposition apparatus. Silver paste was then coated as the conductive adhesive 203 on the surface of the second conductive layer 203 substantially made of a single crystal. A stainless plate having a thickness of 1.5 mm was the bonded as the support 204 for fixing the single crystal layers to the adhesive 203 (FIG. 2(b)).

(Separation of Crystal Layer)

The substrate 503 shown in FIG. 2(b) which had the single crystal layers deposited thereon and the stainless plate bonded through the conductive adhesive was immersed in an aqueous solution of 5% hydrogen fluoride from the side of the substrate having the V-shaped groove 103 formed into a structure having the light-trapping effect to the first conductive layer 201 substantially made a single crystal. The layer 201 was separated from the substrate having the V-shaped grooves 103 by applying ultrasonic vibrations thereto (FIG. 3(a)), and the portion remaining on the side of the stainless plate shown in FIG. 3(b) was then sufficiently washed with flowing water.

$SnO_2$/ITO was then deposited as the transparent electrode 301 on the surface of the layer 201, which was well dried, by the RH method (FIG. 3(c)). In the final step, the current collecting electrodes 401 were formed on the transparent electrode 301 by the printing method in which conductive paste containing Ag powder was printed and the burnt to obtain the thin film single crystal silicon solar cell device shown in FIG. 4.

The I–V characteristics of the thus-obtained thin film single crystal silicon solar cell device were measured by irradiation with light under the conditions of AM 1.5 and 100 mW/cm$^2$. As a result, the photovoltaic conversion efficiency was 17%, and the solar cell device had excellent characteristics as a practical single crystal silicon solar cell device. During the measurement, the solar cell device had an area of 4 cm$^2$.

In addition, a total of ten single crystal silicon solar cell devices were produced by using the same separated substrate having the v-shaped grooves 103 formed into a structure having the light-trapping effect. As a result of measurement of I–V characteristics by the same method as that described above, the scattering in photovoltaic conversion efficiency was within ±5%.

EXAMPLE 2

Figure 6:
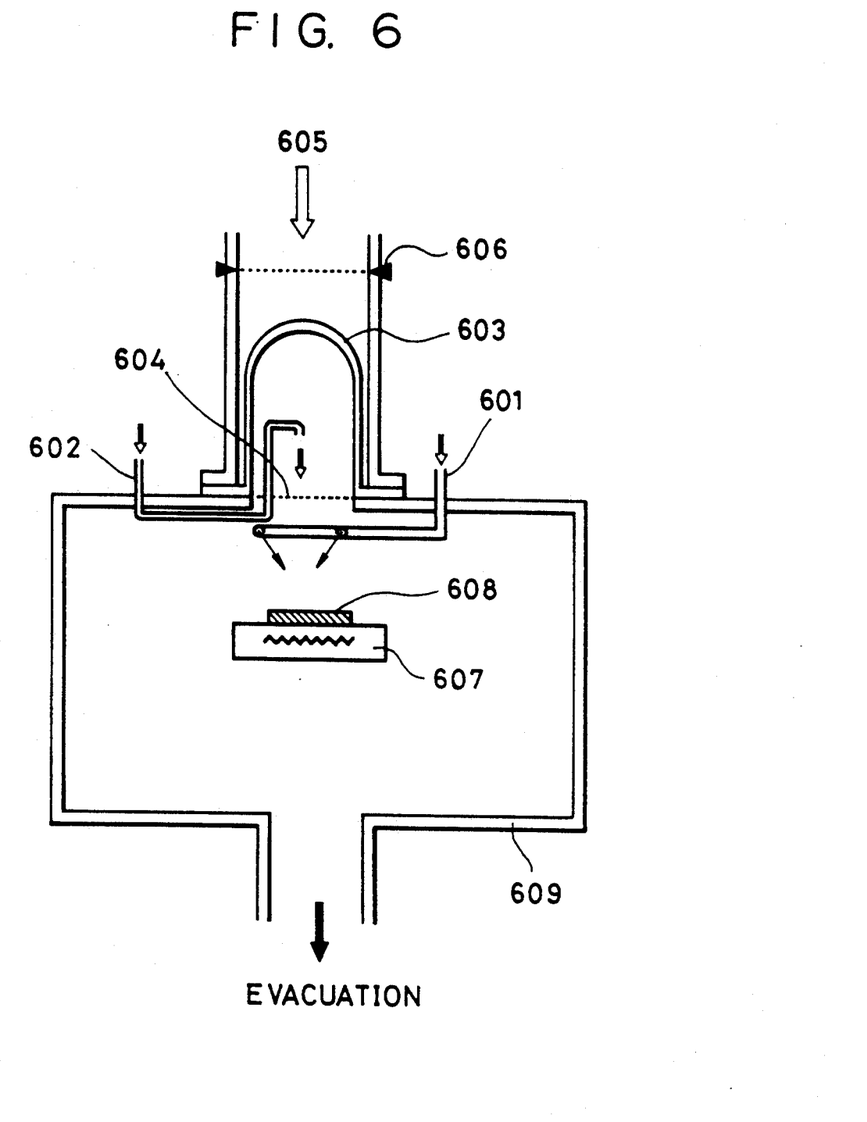

Single crystal silicon films were formed by using the film-forming apparatus schematically shown in FIG. 6 in place of the apparatus shown in FIG. 5 which was used in EXAMPLE 1.

In FIG. 6, reference numeral 601 denotes a gas inlet ring for introducing a compound mainly containing silicon and halogen atoms into a vacuum chamber 603, and reference numeral 602 denotes a gas inlet tube for introducing gas which is a raw material for the active species (B) into a quartz cavity 603. Microwaves are generated from a microwave oscillator (not shown), propagated in a waveguide 605. Standing waves are generated in a portion between a diaphragm 606 and a mesh 604 by appropriately adjusting the diaphragm 606 so that a plasma can be produced from the gas present in the quartz cavity 603. Reference numeral 607 denotes a holder containing a heater which is capable of heating so as to keep the substrate at a desired temperature.

In this example, the substrate having V-shaped grooves formed into a structure having the light-trapping effect by the same method as that employed in Example 1 was disposed as a substrate 608.

Hydrogen gas at 25 sccm and He gas at 35 sccm were introduced into the quartz cavity through the gas inlet tube 602. $Si_2F_6$ gas at 12 sccm was also introduced toward the substrate 608 through the gas inlet ring 601, as shown in FIG. 6. The electric power of the microwave oscillator was adjusted to 300 W, and the diaphragm 606 was adjusted so that a plasma can be produced from the hydrogen gas and He gas in the quartz cavity 603.

Table 2 shows the conditions for producing crystal silicon.

TABLE 2

| Gas Inlet Tube | Gas Species | Gas Flow Rate |
|---|---|---|
| 601 | $Si_2F_6$ | 12 sccm |
| 602 | H2 | 25 sccm |
|  | He | 35 sccm |
| Microwave electric power |  | 300 W |
| Substrate temperature |  | 360° C. |
| Pressure in vacuum chamber |  | 40 mTorr |

The thus-produced hydrogen radicals chemically react with the $Si_2F_6$ gas blown out of the gas inlet ring 601 to deposit a crystal silicon layer on the substrate 608.

The first conductive layer 201 substantially made of a single crystal was first deposited on the substrate 608 by using a mixture of $Si_2F_6$ gas and 1.5 ppm of $BF_3$ gas. As a result, a crystal silicon layer of 0.5 μm was deposited on the substrate 608. The output of the microwave oscillator was then decreased to zero so that deposition is stopped, and the supply of each of the gases was stopped. The vacuum chamber was then sufficiently degassed so that the remaining gas was completely exhausted. The second conductive layer 202 substantially made of a single crystal was then continuously deposited by using a mixture of $Si_2F_6$ gas and 0.7 ppm of $PH_3$ gas under the same conditions as those described above.

The substrate 608 on which the silicon crystal layers were deposited was spontaneously cooled from the substrate temperature 360° C. and then removed from the deposition apparatus used. Silver paste was then coated as the conductive adhesive 203 on the surface of the second conductive layer 202 substantially made of a single crystal. A stainless plate having a thickness of 2.0 mm was then bonded as the support 204 for fixing the single crystal layers (FIG. 2(B)).

The portion of the substrate with the stainless plate bonded thereto ranging from the substrate 608 having the V-shaped grooves formed into a structure having the light-trapping effect to the first conductive layer 201 substantially made of a single crystal was immersed in an aqueous solution of 5% hydrogen fluoride. The layer 201 was separated from the substrate 608 having the V-shaped grooves 103 by applying ultrasonic vibrations (FIG. 3(a)), and the portion remaining on the stainless support was sufficiently washed with flowing water.

$SnO_2$/ITO was then deposited to a thickness of 800Å as the transparent electrode 301 on the surface of the layer 201 which was well dried, by the RH method (FIG. 3(C)). In the final step, the current collecting electrodes 401 were formed on the transparent electrode 301 by the printing method comprising printing conductive paste containing Ag powder and then burning it to obtain the thin film single crystal silicon solar cell device shown in FIG. 4.

The I–V characteristics of the thus-obtained thin film single crystal silicon solar cell device were measured by irradiation of light under the conditions of AM 1.5 and 100 mW/cm$^2$. As a result, the photovoltaic conversion efficiency was 16.5%, and the solar cell device had excellent characteristics as a practical single crystal silicon solar cell device. During the measurement, the solar cell device had an area of 144 cm$^2$.

In addition, a total of seven single crystal silicon solar cell devices were produced by using the same separated substrate having the V-shaped grooves 103 formed into a structure having the light-trapping effect. As a result of measurement of I-V characteristics by the same method as that described above, the scattering in photovoltaic conversion efficiency was within ±7%.

EXAMPLE 3

The film single crystal silicon solar cell devices were produced by the same method as that employed in Example 1 with the exception that the thickness of the nonuniform silicon oxide thin film 104 deposited on the v-shape grooved substrate 103 was changed to the values shown in Table 3.

The I-V characteristics of each of the thus-obtained thin film single crystal solar cell devices were measured by irradiation of light under the conditions of AM 1.5 and 100 mW/cm$^2$. The results of photovoltaic conversion efficiency are also shown in Table 3.

It was found from the results shown in Table 3 that the optimum region of the thickness of the nonuniform silicon oxide thin film 104 formed on the V-shape grooved substrate 103 is 4 to 10Å.

TABLE 3

| Thickness of Silicon Oxide Film (104) (Å) | Conversion Efficiency (%) | Production State |
|---|---|---|
| 1 | — | Inseparable from the V-shape grooved substrate |
| 2 | 7 | Difficult to separate from the V-shape grooved substrate |
| 3 | 8 | Difficult to separate |
| 4 | 17 | Good |
| 10 | 17.5 | Good |
| 50 | 7 | Nonuniform crystal growth surface |
| 100 | 3 | Difficult crystal growth |
| 300 | 0.1 | Difficult crystal growth |

EXAMPLE 4

Thin film single crystal silicon solar cell devices were produced by the same method as that employed in Example 2 with the exception that the thickness of a silicon crystal layer, particularly, the second conductive layer 202 substantially made of a single crystal, was changed to the values shown in Table 4.

The I-V characteristics of each of the thus-obtained thin film single crystal silicon solar cell devices were measured by irradiation of light under the conditions of AM 1.5 and 100 mW/cm$^2$. The results of photovoltaic conversion efficiency are also shown in Table 4.

TABLE 4

| Thickness of Second Single Crystal Layer (202) (μm) | Conversion Efficiency (%) |
|---|---|
| 1 | 1 |
| 2 | 3 |
| 3 | 10 |
| 4 | 14 |
| 5 | 17 |
| 6 | 17 |
| 10 | 17 |
| 20 | 17 |
| 30 | 15 |
| 50 | 14 |
| 150 | 12 |

It was found from Table 4 that the thickness of a silicon crystal layer has an optimum region.

As described above, the production method of the present invention enables the production of a thin film single crystal silicon solar cell device having high conversion efficiency and an uneven surface formed into a structure having the light-trapping effect, and particularly the area of a solar cell device is easily increased. The production method also enables mass production of thin film solar cell devices of high quality at low cost because the substrate can be used several times.

The invention has been described with respect to particular preferred embodiments thereof. It is to be understood, however, that various changes and modifications may be made by those skilled in the art without departing from the sprint and scope of the invention.

What is claimed is:

1. A method for producing a solar cell device, said method comprising the steps of:
    forming on a first substrate at least one semiconductor layer made of a single crystalline material and having an uneven surface;
    forming a photovoltaic element utilizing the semiconductor layer; and
    bonding the photovoltaic element to a second substrate.

2. A method according to claim 1, wherein the first substrate is made of a single crystal semiconductor.

3. A method according to claim 1, wherein the first substrate has a surface of a non-crystalline material.

4. A method according to claim 1, wherein the first substrate has an uneven surface, and the uneven surface of the semiconductor layer has a shape corresponding to the uneven surface of the first substrate.

5. A method according to claim 1, wherein the first substrate has a substantially flat surface, and the uneven surface of the semiconductor layer has a plurality of crystal surfaces.

6. A method according to claim 1, wherein the photovoltaic element comprises a PN junction or a PIN junction.

7. A method according to claim 1, wherein the photovoltaic element is formed on the single crystalline semiconductor layer having the uneven surface by crystal growth of a semiconductor layer of a conduction type different from that of the single crystalline semiconductor layer having the uneven surface.

8. A method according to claim 1, wherein said photovoltaic element is formed by diffusing dopants in a part of the semiconductor layer.

9. A method for producing a solar cell device, said method comprising the steps of:
    forming a thin film insulating layer on a surface of a substrate formed into a structure having an uneven surface;
    forming a first conductive layer substantially made of a single crystal, on the substrate which is disposed in a film-forming space for forming a deposited film, by a chemical reaction between an active species (A) produced by decomposing a compound containing silicon and halogen and an active species (B) having chemical interaction with the active species (A) and produced by a chemical substance used for forming a film, the active species (A) and (B) being simultaneously or separately introduced;
    forming a second conductive layer substantially made of a single crystal on the first substantially single crystal conductive layer by the same method as that employed for forming the first substantially single crystal conductive layer; and separating the first and second substantially single crystal conductive layers from the surface of the substrate having the uneven surface.

10. A method according to claim 9, wherein the substrate having the uneven surface is used a plurality of times in order to produce a plurality of the solar cell devices.

11. A method for producing a solar cell device, said method comprising the steps of:

forming on a first substrate at least one semiconductor body made of a single crystalline material and having an uneven surface;

forming a photovoltaic junction utilizing the semiconductor body;

bonding the semiconductor body to a second substrate; and separating the semiconductor body from the first substrate.

12. A method according to claim 11, further comprising the step of forming an electrode on the semiconductor body which is bonded to the second substrate.

13. A method according to claim 11, wherein the photovoltaic junction is formed in the semiconductor body.

14. A method according to claim 11, wherein the photovoltaic junction is formed on the semiconductor body.

15. A method according to claim 11, wherein said step of forming the semiconductor body comprises a step of forming a plurality of laterally spaced thin insulating films between the semiconductor body and the first substrate.

16. A method according to claim 1, wherein the substrate having the uneven surface is used a plurality of times in order to produce a plurality of the solar cell devices.

* * * * *

UNITED STATES PATENT AND TRADEMARK OFFICE
CERTIFICATE OF CORRECTION

PATENT NO. : 5,248,621

DATED : September 28, 1993

INVENTOR(S) : MASAFUMI SANO

It is certified that error appears in the above-identified patent and that said Letters Patent is hereby corrected as shown below:

COLUMN 5

Line 52, "$B_4H_{10}$," should read --$B_4H_{10}$,-- and "$B_6H_{12}AlC_{13}$" should read --$B_6B_{12}$, $AlC_{13}$--.

COLUMN 8

Line 62, "the" (first occurrence) should read --then--.

COLUMN 9

Line 17, "the" (first occurrence) should read --then--.

COLUMN 11

Line 6, "The film" should read --Thin film--.

COLUMN 12

Line 12, "sprint" should read --spirit--.

Signed and Sealed this

Seventh Day of June, 1994

*Attest:*

BRUCE LEHMAN

*Attesting Officer*    *Commissioner of Patents and Trademarks*